United States Patent [19]

Margulis et al.

[11] Patent Number: 5,200,719
[45] Date of Patent: Apr. 6, 1993

[54] IMPEDANCE-MATCHING COUPLER

[75] Inventors: Walter Margulis; Maria C. R. Carvalho, both of Rio de Janeiro, Brazil

[73] Assignee: Telecommunicacoes Brasileiras S/A, Campinae, Brazil

[21] Appl. No.: 772,329

[22] Filed: Oct. 7, 1991

Related Application Data

[63] Continuation of PCT/BR90/00020 filed Aug. 2, 1991, now abandoned.

[30] Foreign Application Priority Data

Dec. 7, 1989 [BR] Brazil .................................. 8906400

[51] Int. Cl.⁵ .............................................. H01P 5/08
[52] U.S. Cl. ...................................... 333/34; 333/238
[58] Field of Search .................... 333/33, 34, 238, 246

[56] References Cited

U.S. PATENT DOCUMENTS

| | | | |
|---|---|---|---|
| 2,913,686 | 11/1959 | Fubini et al. | 333/238 |
| 3,093,805 | 6/1963 | Osifchin et al. | 333/238 X |
| 4,862,120 | 8/1989 | Ruxton et al. | 333/34 |

FOREIGN PATENT DOCUMENTS 5102 1/1989 Japan ..................................... 333/33

OTHER PUBLICATIONS

Rowe et al., *Numerical Analysis of Shielded Coplanar Waveguides*, IEEE Trans. on MTT, vol. MTT-31, No. 11, Nov. 1983, pp. 911-915.

*Primary Examiner*—Paul Gensler
*Attorney, Agent, or Firm*—Finnegan, Henderson, Farabow, Garrett & Dunner

[57] ABSTRACT

A coupling device has a dielectric substrate with at least two joined transmission lines formed thereon. The two transmission lines have a common signal carrying conductor and separate ground plane conducting means. The conductor cross-section and the conductor spacing cross-section are varied along the length of the transmission lines to provide a large change of the characteristic impedance of the coupling device along the line length.

9 Claims, 4 Drawing Sheets

1

IMPEDANCE-MATCHING COUPLER

Continuation of PCT/BR90/00020 filed Aug. 2, 1991, now abandoned.

This invention relates to the coupling of electric signals to and from high-speed electronic devices, and more particularly, to the semiconductor laser diodes driven by high-frequency signals or very short pulses, and from high-speed photodiodes.

In order to exploit fully the potential of optical communications, it is necessary to make use of high-speed light sources. In particular, systems have been described where semiconductor lasers were modulated at frequencies above 15 GHz, and picosecond and subpicosecond optical pulse generation with laser diodes has been reported by several groups, such as, for instance, Vasillev and Sergeav "Generation of bandwidth-limited 2 ps pulses with 100 GHz repetition rate . . . ", Electronics Letters 1989, 25.

A key factor in most systems is pumping the laser diode with a short electrical pulse, in order to quickly raise it above lasing threshold. Although devices are known which can generate pulses of adequate shape and power level, most of this power is reflected back from the semiconductor laser, due to the mismatch between the usual generator impedance, typically on the order of 50 ohms, and the laser diode's characteristic impedance, which falls below 5 ohms. To minimize such reflections, it is common practice to insert, in series with the laser and physically close to it, a resistance of about 45 ohms. In this case, however, the power delivered to the laser is less than 10% of the input drive, the remaining 90% or more being lost as heat in the resistance. Moreover, with the usual setup, the laser's stray capacitance discharge occurs mostly through the laser diode itself, as the shunt impedance presented by the resistance is about 10 times higher than that of the semiconductor laser, limiting the frequency response.

A similar problem exists when detecting short duration light pulses with a high-speed photodiode such as a PIN photodiode. The shunt impedance of the coupling line, which is of the order of 50 ohms, limits the discharge time of the photodetector.

Another known way of providing a better match is through the use of stubs. This procedure is limited to a narrow band of frequencies, and is not generally used.

Another known matching procedure is through the use of a tapered line section, such as mentioned in the German Patent Application No. DE 2311304. This known matching device has the drawback of giving rise to parasitic transversal modes with the wide linewidths required to match impedances in the ranges of interest. In effect, a tapered line section which has ann impedance of, for instance, 5 ohms at its wide end, requires a greatest width of 18.2 mm when a beryllium oxide substrate slab 0.635 mm thick is used. Such a width may make the occurrence of parasitic transversal modes possible above 3.5 GHz, rendering this device inadequate for operations at higher frequencies.

It is an object of the invention to provide an impedance-matching coupling device wherein those drawbacks are obviated, which is suitable for matching a generator to a load with impedance value ratios up to about 10:1, over a wide frequency band, achieving a substantially constant coupling ratio throughout this frequency band.

Another object of the invention is the decrease of the load's stray capacitive discharge time, by connecting in parallel with such load an impedance which effectively shunts part of the discharge current.

In accordance with the present invention, there is provided an electrical coupler for matching different impedance values, consisting of a transmission-line-like device in which a signal-carrying conductor is shared by at least two diverse flat-conductor transmission line structures, while the corresponding ground-plane conductors independently maintain the positional relationship to said signal-carrying conductor that characterizes each of the structures so joined, the characteristic impedance of the device undergoing a gradual change of value achieved through a gradual variation of the spacings between said ground-plane conductors and said signal-carrying conductor, as well as through a change of the widths of said conductors.

In accordance with a further feature of the invention, all said dimensional variations bring about impedance changes which add up along the length of the device.

In accordance with a still further feature of the invention, said variations are made continuously or by small steps.

The invention will now be described with reference to embodiments shown in the accompanying figures, the impedance-matching coupling device being used to drive a semiconductor laser diode, or to couple electrical signals from a photodetector to further electronic circuitry. Herein:

Figure 1:
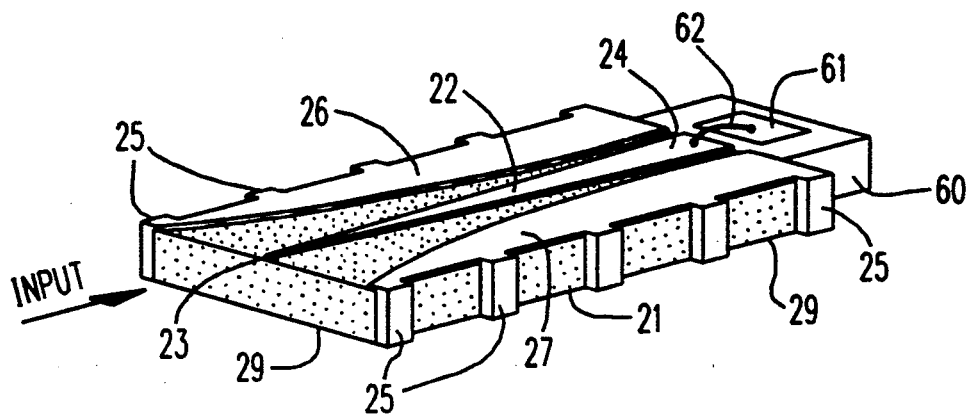
FIG. 1 shows a perspective view of a first embodiment of the invention.

Referring to FIG. 1, the impedance-matching coupling device comprises a dielectric slab 21 of uniform thickness and substantially rectangular shape, supporting on the upper face a coplanar transmission line formed by the signal-carrying conducting strip 22, centrally located, alongside which two ground planes 26 and 27 are placed; the lower surface of the slab supports a conducting ground plane 28 which makes up, in combination with said strip 22, a microstrip transmission line. Ground-plane conductors 26, 27 and 29 are electrically joined at both ends of the device, as well as on several intermediate points, by shorting straps or wires 25.

At the output end of the coupler there is attached a metallic submounting block 60 carrying a semiconductor laser diode 61, said block being electrically connected by way of soldering to the lower ground plane 29 and to ground semi-planes 26 and 27. The upper electrode of the laser diode 61 is electrically joined to the wide end 24 of the signal-conducting central strip 22 by means of a golden wire 62, welded at both ends by thermocompression. To avoid contact between said block and the strip 22, the latter is slightly recessed from the rear face (not shown) of substrate slab 21.

As shown in FIG. 1 the signal-carrying metal conducting strip 22 is narrower at the coupler's high-impedance input end 23 and wider at the low-impedance output end 24. Simultaneously, the gap between ground planes 26, 27 and said central strip is wider at the input end of the coupler, becoming progressively narrower toward the output end, where it reaches minimum width.

As is well known, the impedance of a microstrip line, such as formed by strip 22 and ground plane 29, is inversely proportional to the signal-carrying strip's relative width (see FIG. 23, p. 29–25 of 7th edition "Reference Data for Engineers: . . . ", Howard W. Sams & Co.), therefore, the line presents, at the input end, a higher impedance than at the output end. Moreover, a coplanar line's impedance is directly proportional to the gap between the semi-planes and the strip (see FIG. 28, p. 29–25, op. cit.); consequently, the coplanar structure formed by strip 22 and semi-planes 28 and 27, presents, at the input end of the coupler, a higher impedance value, which gradually becomes lower toward the output end of the device. Besides, the electromagnetic coupling between said strip 22 and the ground plane 29 at the input end 23 is much stronger than between the same strip and the semi-planes 26 and 27, so that the impedance at this end of the coupler is determined mainly by the microstrip structure.

A first example of the invention was built, using a 0.254 mm thick alumina substrate slab (dielectric constant = 10), with a length of 5 cm and 2.75 cm approximate width. A ground plane was provided on the substrate's lower surface and a tapered signal-conducting metallic strip on the upper surface, centrally located, widening linearly from 0.25 mm at the high-impedance end to 1.2 mm at the low-impedance end of the coupler; alongside said strip, two grounded semi-planes were provided, the gap between the strip and the semi-planes varying from 12.4 mm at the higher-impedance and to 10 micro meters at the lower-impedance end. Measurements of the coupler's characteristic impedance were made using a time-domain reflectometer: the impedance value dropped from 50 ohms at the input port to 18 ohms at the low-impedance output port.

Figure 2:
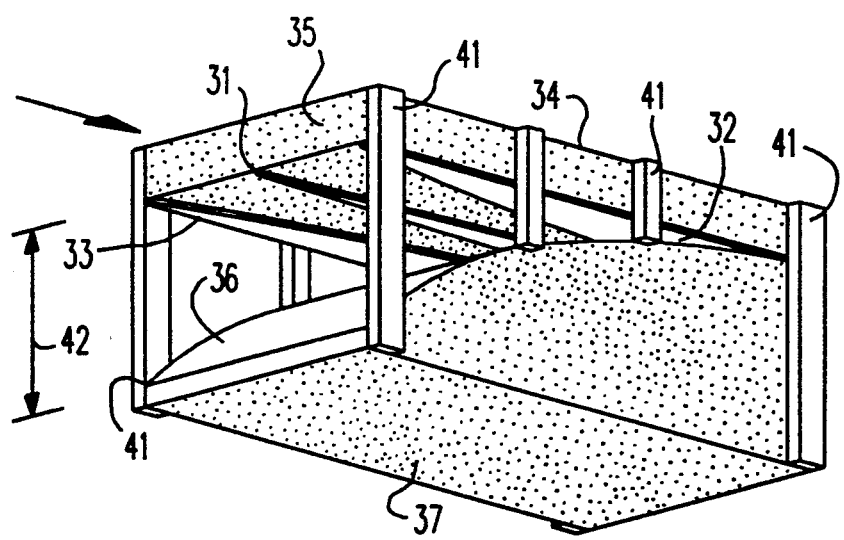
FIG. 2 shows a perspective view of a second embodiment of the invention.

FIG. 2 shows a second embodiment of the invention, in which an additional ground plane 36 was added to the structure shown in FIG. 1, the distance between said plane and the signal-carrying strip's plane being greater at the coupler's high-impedance end, decreasing gradually toward the low-impedance end. In this coupler, the simultaneous presence of two coplanar semi-planes 32, 33 on either side of the center conductor 31, a ground plane 34 on the upper surface of the substrate slab 35 and an additional ground plane 36 strongly confine the electromagnetic field, so that very low impedance can be reached on the output end, as a result of the additive individual characteristic impedance changes on the structures so joined, brought about by the following changes in each structure:

a—in the microstrip structure formed by ground-plane 34 and central conducting strip 31, a gradual increase in said strip's width, bringing about a gradual decrease in the characteristic impedance;

b—in the coplanar structure formed by the grounded semi-planes 32, 33 and the central conducting strip 31, a gradual decrease of the gap widths, resulting in a gradual decrease of the characteristic impedance;

c—in the stripline structure formed by the central conducting strip 31 and ground plane 34 and additional ground plane 36, a gradual reduction of the distance between said additional ground plane 36 and said strip's plane, bringing about a gradual decrease of the characteristic impedance value.

As shown in FIG. 2, all ground conductors are electrically joined at several positions along the edges of the coupler, by shorting straps 41, which also function as mechanical spacing means for correctly positioning of the additional ground conductor 36. In said figure, a rigid insulating block 37 provides a backing to this conducting sheet. The same effect can be attained with a metallic block having the upper surface shaped in accordance with the curve of said ground conductor 36.

Although FIG. 2 shows air as the dielectric between ground foil 36 and signal-conducting strip 31, the surface of said foil can be provided with a thin insulating sheet or film, enabling a very close approach between the ground foil and the conducting strip at the low-impedance end of the coupler, while avoiding any physical contact and resulting short-circuiting. Furthermore, filling the gap with a dielectric film renders it less prone to variation due to temperature or vibration effects, and stabilizes the low-impedance value of the coupler.

A second example of the invention was built along the lines of the structure shown in FIG. 2, in which the dielectric slab 35 as well as strips 31, 32, 33 and 34 have the same dimensions as the equivalent elements in the aforementioned first example. The additional ground foil's gap 42 at the high impedance end was 8 mm, this gap narrowing toward the coupler's opposite end; a Mylar foil 10 micro-meters thick was attached to this foil's surface, so as to bring about a minimum gap of 10 um between ground foil 36 and strip 31 at the low-impedance end of the coupler.

Figure 3:
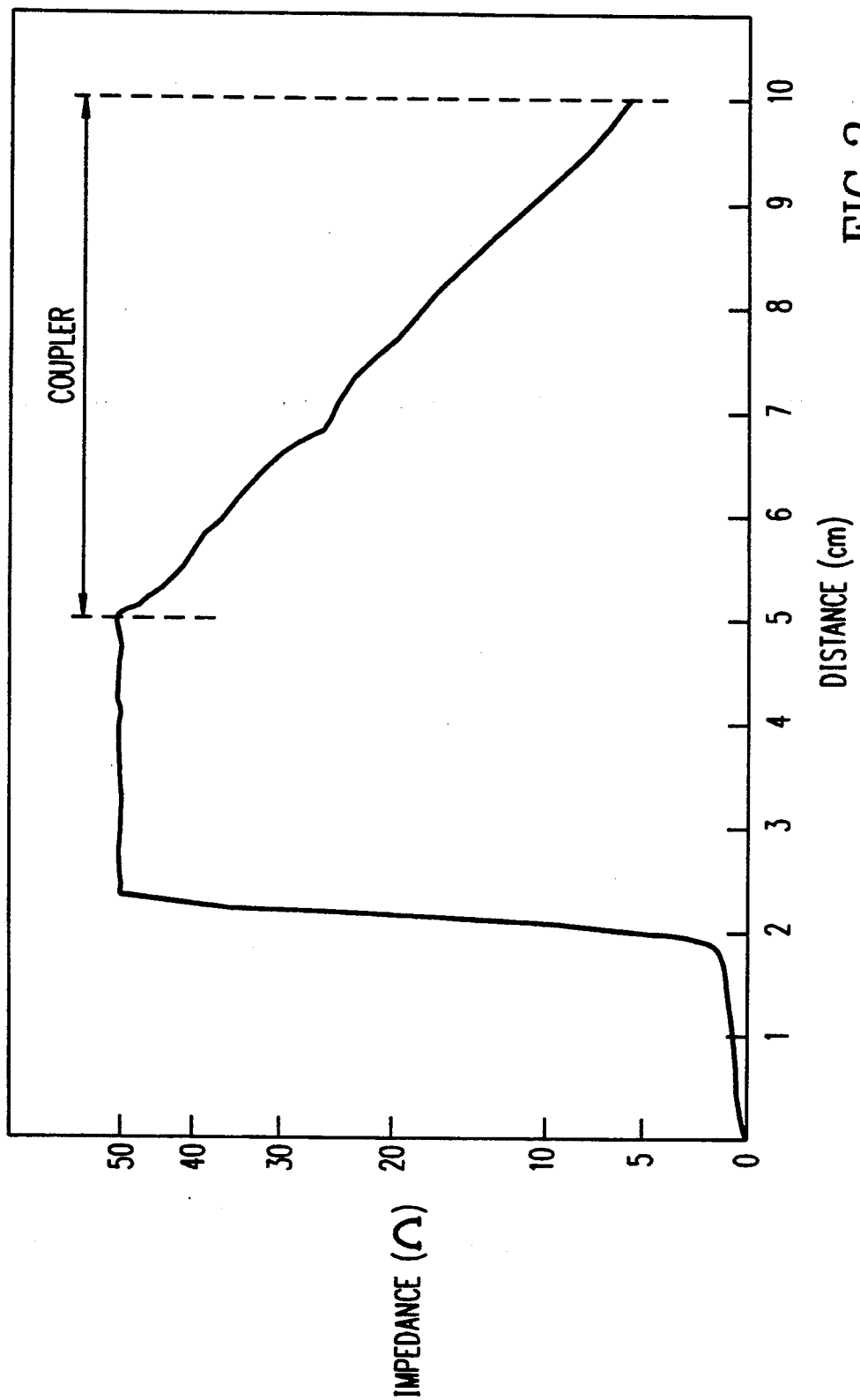
FIG. 3 shows the characteristic impedance variation of the coupler shown on FIG. 2.

Measurements made with a HP 1815B time-domain reflectometer and HP 1817A sampler with 20 ps rise-time show a gradual impedance drop from 50 ohms at the high-impedance ende to 5.5 ohms at the low-impedance end, as shown in FIG. 3. For this particular measurement, two identical couplers were mounted back-to-back, so that the impedance goes to minimum value and rises again to 50 ohms; for clarity, only the first half of the trace is shown.

In order to verify experimentally the coupler's effectiveness, the optical response of a laser diode fed by the coupler was compared with the same laser's response fed by a conventional 50-ohm transmission line, without a matching series resistor. Through the use of appropriate networks, a DC bias current and short electrical pulses could be applied to the laser diode. The pulses' features could be modified throughout the test, with a maximum voltage of 10 V and pulsewidth of either 100 ps or 70 ps. For a bias current of 110 mA, the 100 ps pulse voltage needed to bring the laser above threshold was 3 V when fed through the couple described with reference to Example 2, or about half the voltage (6 V) that was needed when the 50-ohm line was used to feed the laser.

Figure 5:
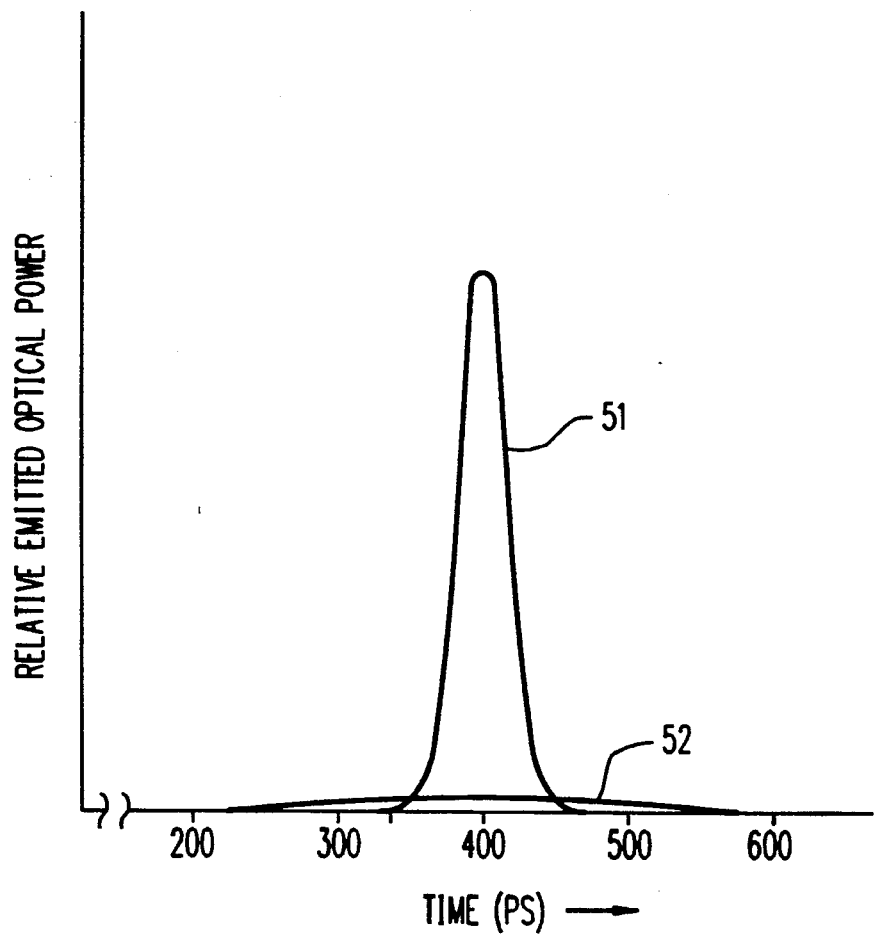
FIG. 5 shows the comparative intensities of emitted light as a function of time, for a laser diode driven through a conventional transmission line and through the coupling device shown in FIG. 2.

FIG. 5 shows the optical response from the laser when fed through the impedance-matching coupler (curve 51), compared to the response with the laser fed through a 50-ohm line with a 45-ohm matching resistor (curve 52); in this latter case, neither 70 ps or 100 ps electrical pulses could bring the laser above threshold, showing that most of the available power was dissipated.

The herein described coupler's usefulness is not limited to the driving of laser diodes. When used to couple a PIN photodiode, a definite bandwidth increase was evident, when compared with a conventional 50-ohm transmission line coupling. The light source used was a CW mode-locked and frequency-doubled Nd:YAG laser producing 70 ps pulses at 0.532 um wavelength. A Telefunken S 181 P diode with 200 ps risetime into a 50-ohm load was initially connected to the end of a conventional 50-ohm microstrip transmission line and DC biased biased to 50 V through a HP 11590A bias network. The detected pulses were sampled and displayed with a Tektronix S4 sampling head and a 7704 oscilloscope. Alternatively, the photodiode was coupled to the end of the impedance-matching coupler.

Figure 4:
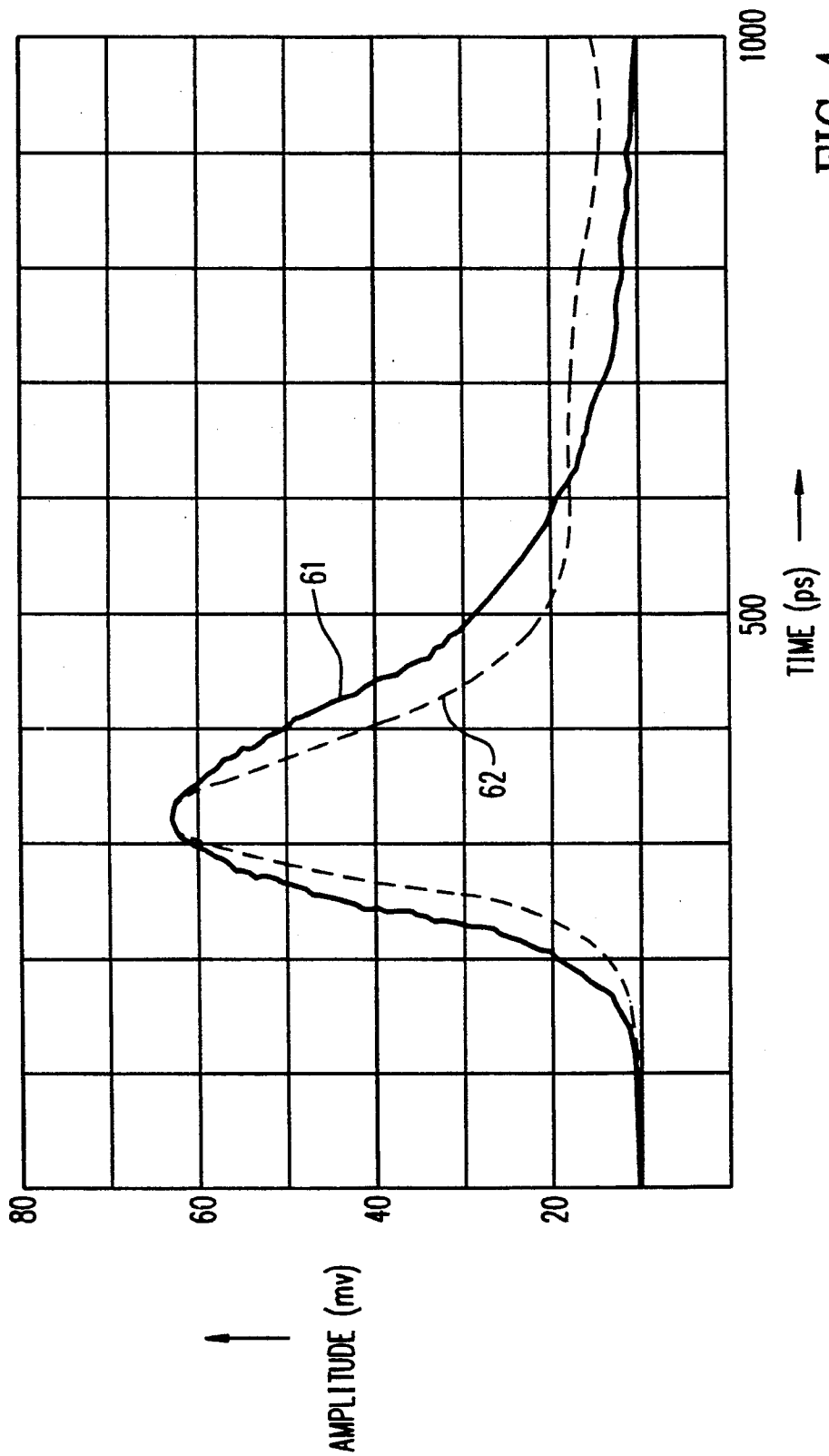
FIG. 4 shows the waveshape of an electric signal furnished by a photodetector, when coupled to a conventional transmission line and when coupled to the coupler described herein.

FIG. 4 shows the resulting oscilloscope traces, curve 61 being the photodiode's response when coupled through the 50-ohm line, and curve 62 when the impedance-matching coupler was used to couple the electrical pulses from the photodetector to a high-speed sampling oscilloscope. As can be readily seen, both the rise and fall times in curve 62 are significantly shorter. It should be noted than the improvement will be even greater for photodiodes with very low series resistance.

Although the impedance-matching coupler described herein was developed for coupling opto-electronic components, its usefulness extends to any type of wideband impedance match.

Furthermore, it should be understood that, not notwithstanding the fact that the invention was described with reference to the specific embodiments shown in FIGS. 1 and 2, it will be understood by one skilled in the art that changes in form and in details can be made, while remaining within the scope of the invention. For instance, the shorting straps 25 or 41 can be replaced by a continuous metal sheet, or the slabs 21 or 32 can be made thinner at the low-impedance end. The substrate in the examples was alumina, but other materials with higher dielectric constants can be used, with even better performance and smaller dimensions.

We claim:

1. A coupling device for matching different impedance values, said device comprising:
   an elongated dielectric substrate;
   a signal carrying conductor extending along said substrate;
   first ground plant conducting means extending along said substrate and spaced from said signal carrying conductor to form a first transmission line therewith;
   at least second ground plane conducting means extending along said substrate generally coextensively with said first ground plane conducting means and spaced from said signal carrying conductor to form a second transmission line therewith;
   the conductor cross-section and the conductor spacing cross-section for each of the transmission lines being varied along the length thereof to change the respective impedances thereof along the line length and to change the characteristic impedance of the coupling device along the line length.

2. The coupling device of claim 1 wherein said transmission line cross-sections are varied to provide additive impedance changes for said first and second transmission lines.

3. The coupling device of claim 1 or 2 wherein said transmission line cross-sections are gradually varied over the length of the transmission lines.

4. The coupling device of claim 1 or 2 wherein:
   said signal carrying conductor is a planar conductor;
   said first ground plane conducting means being coplanar with said signal carrying conductor to characterized the first transmission line as a coplanar transmission line; and
   said second ground plane conducting means being structured relative to said signal carrying conductor to characterize the second transmission line as a microstrip transmission line.

5. A coupling device for matching different impedance values, said device comprising:
   an elongated plate of dielectric substrate;
   a signal carrying conductor extending along a first face surface of said plate;
   first ground plane conducting means extending along said first face surface and spaced from said signal carrying conductor to form a first transmission line therewith:
   second ground plane conducting means extending along a second face surface of said plate opposite to said first face surface and generally coextensively with said first ground plane conducting means and spaced from said signal carrying conductor to form a second transmission line therewith;
   third ground plane conducting means extending along and supported in spaced relation to said first face surface generally coextensive with first ground plane conductor and separated by a dielectric gap from said signal carrying conductor to form a third transmission line therewith;
   the conductor cross-section and the conductor spacing cross-section for each of the transmission lines being varied along the length thereof to change the respective impedances thereof along the line length and to change the characteristic impedance of the coupling device along the line length.

6. The coupling device of claim 3 wherein said transmission line cross-sections are varied to provide additive impedance changes for said first, second and third transmission lines.

7. The coupling device of claim 6 wherein said transmission line cross-sections are varied substantially linearly.

8. The coupling device of claim 6 wherein at least one of said transmission line cross-section is varied non-linearly.

9. The coupling device of claim 5, 6, 7 or 8 wherein:
   said signal carrying conductor is a planar conductor;
   said first ground plane conducting means being coplanar with said signal carrying conductor to characterize the first transmission line as a coplanar transmission line;
   said second ground plane conducting means being structured relative to said signal carrying conductor to characterize the second transmission line as a microstrip transmission line; and
   said third ground plane conducting means being structured relative to said signal carrying conductor to characterize the third transmission line as a microstrip transmission line.

* * * * *

UNITED STATES PATENT AND TRADEMARK OFFICE
CERTIFICATE OF CORRECTION

PATENT NO. : 5,200,719
DATED      : April 6, 1993
INVENTOR(S) : MARGULIS et al.

It is certified that error appears in the above-identified patent and that said Letters Patent is hereby corrected as shown below:

IN THE CLAIMS:

Column 6, line 8, change "terized" to --terize--;

line 25, delete "and";

line 31, change "coextensive with first" to --coextensively with said first--;

line 49, change " cross-section" to --cross- sections--.

Signed and Sealed this

Eighth Day of February, 1994

Attest:

BRUCE LEHMAN

*Attesting Officer*     Commissioner of Patents and Trademarks

UNITED STATES PATENT AND TRADEMARK OFFICE
CERTIFICATE OF CORRECTION

PATENT NO. : 5,200,719
DATED : April 6, 1993
INVENTOR(S) : Margulis et al

It is certified that error appears in the above-indentified patent and that said Letters Patent is hereby corrected as shown below:

Column 6, line 32, change "conductor" to --conducting means--.

Signed and Sealed this

Fifth Day of April, 1994

Attest:

BRUCE LEHMAN

Attesting Officer

Commissioner of Patents and Trademarks